(12) United States Patent
Sharma et al.

(10) Patent No.: US 11,152,429 B2
(45) Date of Patent: Oct. 19, 2021

(54) THRESHOLD SWITCHING CONTACT IN A FIELD-EFFECT TRANSISTOR AS A SELECTOR

(71) Applicant: INTEL CORPORATION, Santa Clara, CA (US)

(72) Inventors: Abhishek A. Sharma, Hillsboro, OR (US); Brian S. Doyle, Portland, OR (US); Ravi Pillarisetty, Portland, OR (US); Prashant Majhi, San Jose, CA (US); Elijah V. Karpov, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 690 days.

(21) Appl. No.: 15/942,115

(22) Filed: Mar. 30, 2018

(65) Prior Publication Data
US 2019/0305045 A1 Oct. 3, 2019

(51) Int. Cl.
*H01L 27/24* (2006.01)
*H01L 43/08* (2006.01)
(Continued)

(52) U.S. Cl.
CPC .... *H01L 27/2436* (2013.01); *H01L 27/10805* (2013.01); *H01L 27/10873* (2013.01);
(Continued)

(58) Field of Classification Search
CPC ......... H01L 27/10805; H01L 27/10873; H01L 27/228; H01L 27/2436; H01L 29/16;
(Continued)

(56) References Cited

U.S. PATENT DOCUMENTS

2013/0200447 A1* 8/2013 Yen .................. H01L 28/20
257/296
2015/0091067 A1 4/2015 Pillarisetty et al.
(Continued)

OTHER PUBLICATIONS

Yu, Dong et al., "Minimum Voltage for Threshold Switching in Nanoscale Phase-Change Memory", Nano Letters, vol. 8, No. 10, 2008, American Chemical Society, pp. 3429-3433.
(Continued)

*Primary Examiner* — Allan R Wilson
(74) *Attorney, Agent, or Firm* — Schwabe, Williamson & Wyatt, P.C.

(57) ABSTRACT

An integrated circuit structure includes: a field-effect transistor including a semiconductor region including a semiconductor material having a bandgap less than or equal to that of silicon, a semiconductor source and a semiconductor drain, the semiconductor region being between the semiconductor source and the semiconductor drain, a gate electrode, a gate dielectric between the semiconductor region and the gate electrode, a source contact adjacent to the semiconductor source, and a drain contact adjacent to the semiconductor drain; and a resistive switch or a capacitor electrically connected to the drain contact. One of the source contact and the drain contact includes a threshold switching region, to be a selector for the resistive switch or the capacitor. In some embodiments, the threshold switching region includes a threshold switching oxide or a threshold switching chalcogenide, and the resistive switch or the capacitor is part of a resistive memory cell or capacitive memory cell.

20 Claims, 9 Drawing Sheets

(51) Int. Cl.
*H01L 27/22* (2006.01)
*H01L 29/786* (2006.01)
*H01L 29/16* (2006.01)
*H01L 29/20* (2006.01)
*H01L 29/78* (2006.01)
*H01L 27/108* (2006.01)
*H01L 43/12* (2006.01)
*H01L 45/00* (2006.01)
*H01L 29/66* (2006.01)

(52) U.S. Cl.
CPC .......... *H01L 27/228* (2013.01); *H01L 29/16* (2013.01); *H01L 29/20* (2013.01); *H01L 29/66522* (2013.01); *H01L 29/66742* (2013.01); *H01L 29/66795* (2013.01); *H01L 29/785* (2013.01); *H01L 29/78681* (2013.01); *H01L 29/78684* (2013.01); *H01L 29/78696* (2013.01); *H01L 43/08* (2013.01); *H01L 43/12* (2013.01); *H01L 45/065* (2013.01); *H01L 45/08* (2013.01); *H01L 45/144* (2013.01); *H01L 45/146* (2013.01); *H01L 45/1608* (2013.01)

(58) Field of Classification Search
CPC ... H01L 29/20; H01L 29/45; H01L 29/66522; H01L 29/66742; H01L 29/66795; H01L 29/785; H01L 29/78681; H01L 29/78684; H01L 29/78696; H01L 43/08; H01L 43/12; H01L 45/065; H01L 45/08; H01L 45/144; H01L 45/146; H01L 45/1608
See application file for complete search history.

(56) References Cited

U.S. PATENT DOCUMENTS

2016/0133635 A1* 5/2016 Hsiung ............ H01L 27/11521
257/4
2019/0341548 A1* 11/2019 Neumann ........... H01L 45/1253

OTHER PUBLICATIONS

Frougier, J. et al., "Phase-Transition-FET exhibiting steep switching slope of 8mV/decade and 36% enhanced ON current," IEEE Symposium on VLSI Technology, 2016, Honolulu, HI, pp. 1-2.

Shukla1, Nikhil et al., "A Steep-Slope Transistor Based on Abrupt Electronic Phase Transition", Nature Communications, 2015, DOI: 10.1038/ncomms8812, Macmillan Publishers Limited, pp. 1-6.

Alexander Pergament et al., "Vanadium Dioxide: Metal-Insulator Transition, Electrical Switching and Oscillations. A Review of State of the Art and Recent Progress", presented as an oral talk at the Energy Materials and Nanotechnology (EMN) Meeting on Computation and Theory, Nov. 9-12, 2015, Istanbul, Turkey, 25 pages.

* cited by examiner

THRESHOLD SWITCHING CONTACT IN A FIELD-EFFECT TRANSISTOR AS A SELECTOR

BACKGROUND

Narrow bandgap channel materials can improve the performance of field-effect transistors (FETs). For example, narrow bandgap channel materials can drive higher currents in FETs than large bandgap channel materials. The higher drive currents can be useful, for example, for driving resistive or capacitive memory devices, especially at faster cycle times and higher reset currents. However, there are a number of non-trivial performance issues associated with narrow bandgap channel materials in FETs.

BRIEF DESCRIPTION OF THE DRAWINGS

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

A field-effect transistor (FET) is disclosed, the structure including narrow bandgap channel material and a threshold switch selector in one of the source and drain contacts. The FET can control, for example, current to a resistive switch or a capacitor coupled to the drain contact of the FET, according to an embodiment. The narrow bandgap channel material can include semiconductor material having a bandgap no greater than that of silicon. The threshold switch selector (or selector device or simply selector) can include a threshold switching oxide or a threshold switching chalcogenide to help regulate current supplied through the FET. For example, the FET can supply current to a resistive or capacitive memory cell that is part of a resistive or capacitive memory, such as magnetoresistive random-access memory (MRAM), resistive random-access memory (RRAM), phase-change random-access memory (PRAM), or dynamic random-access memory (DRAM). The FET can be part of a front end of line (FEOL) circuit, such as a FinFET, or a back end of line (BEOL) circuit, such as a thin-film transistor (TFT). Numerous other FET configurations will be apparent.

General Overview

As noted above, there are a number of non-trivial performance issues associated with narrow bandgap channel materials in FETs. For instance, such FETs can suffer from high leakage current, especially at high drain to source voltages. Such voltages can be useful for driving circuits such as resistive switches or capacitors with large currents (e.g., for applications such as driving resistive or capacitive memory cells at high speeds). However, because of effects such as gate-induced drain leakage (GIDL), band-to-band tunneling (BTBT), and sneak paths in memory arrays accessed through such FETs, to name a few, narrow bandgap transistors can experience leakage current and related impacts (such as memory cell corruption, high gate to source/drain coupling, and the like), especially with high-speed switching applications. Such leakage current can cause standby power in, for example, RRAM arrays driven by such FETs to increase by over a hundred-fold at high drain to source voltages.

Accordingly, techniques are provided herein for a threshold switching contact in a FET as a selector (or selector device). The FET can be used, for example, in conjunction with a resistive switch or a capacitor, such as in the case of a resistive or capacitive memory cell, electrically connected to the drain contact of the FET, according to some embodiments. In various embodiments, a threshold switch selector is provided in the source or drain contact of a narrow-bandgap channel material FET. The threshold switch selector acts as a source of resistance (to reduce leakage current and related effects such as gate to source/drain coupling) when the FET is turned off, and otherwise allows the current to flow normally when the FET is turned on and sufficient (e.g., threshold) drain to source voltage is applied to the terminals of the threshold switch selector. Further, during periods of FET saturation current, the selector can remain on with a reduced (e.g., holding) drain to source voltage applied to the terminals of the threshold switch selector.

In some embodiments, threshold switching material in the form of a threshold switching oxide (such as niobium dioxide, tantalum oxide, vanadium dioxide, or nickel oxide, to name a few) or threshold switching chalcogenide (such as silicon tellurium arsenic germanium) is provided in one of the source and drain contacts to act as a selector for the resistive switch or capacitor. The FET can be, for example, a frontend FET, such as a FinFET, with a Group IV (e.g., silicon, silicon-germanium alloy, germanium) or Group III-V channel, or a backend FET, such as a TFT (e.g., a top gate TFT) with an oxide channel such as one or more of zinc oxide, indium oxide, indium tin oxide, aluminum zinc oxide, indium zinc oxide, indium gallium zinc oxide, gallium zinc oxide, tin oxide, cobalt oxide, copper oxide, and titanium oxide.

In an example embodiment of the present disclosure, an integrated circuit (IC) structure is provided. The IC structure includes a field-effect transistor (FET) including a semiconductor region including a semiconductor material having a bandgap less than or equal to that of silicon. The FET further includes a semiconductor source and a semiconductor drain, where the semiconductor region is between the semiconductor source and the semiconductor drain. The FET further includes a gate dielectric adjacent to the semiconductor region, and a gate electrode with the gate dielectric being between the semiconductor region and the gate electrode. The FET further includes a source contact adjacent to the semiconductor source and a drain contact adjacent to the semiconductor drain. The IC structure further includes a resistive switch or a capacitor electrically connected to the drain contact. One of the source contact and the drain contact includes a threshold switching region, to act as a selector for the resistive switch or the capacitor. In some embodiments, the resistive switch or the capacitor is part of a resistive memory cell or a capacitive memory cell. In some such embodiments, the resistive memory cell or capacitive memory cell is part of a resistive memory (such as RRAM, MRAM, or PRAM) or a capacitive memory (such as DRAM).

Numerous other example embodiments and configurations will be apparent in light of this disclosure.

System Architecture

FIGS. 1A-1D are cross-sectional (Y-Z) views of example field-effect transistors (FETs) and corresponding resistive or capacitive memory cells 100, 102, 104, and 106, according to embodiments of the present disclosure. Here, X, Y, and Z represent orthogonal dimensions (such as length, width, and height, with the X and Y dimensions being planar or horizontal dimensions and the Z dimension being the vertical dimension). For example, if the FETs and corresponding resistive or capacitive memory cells are part of memory arrays that include the memory cells at crossing regions of wordlines and bitlines, the X-dimension can represent the wordline direction, while the Y-dimension can represent the bitline (and source line) direction. See also FIGS. 3A-3B for illustrative embodiments of this arrangement. For ease of description, the same or similarly named and numbered structures in FIGS. 1A-1D may be described once in greater detail and further descriptions may not be repeated.

Figure 1A:
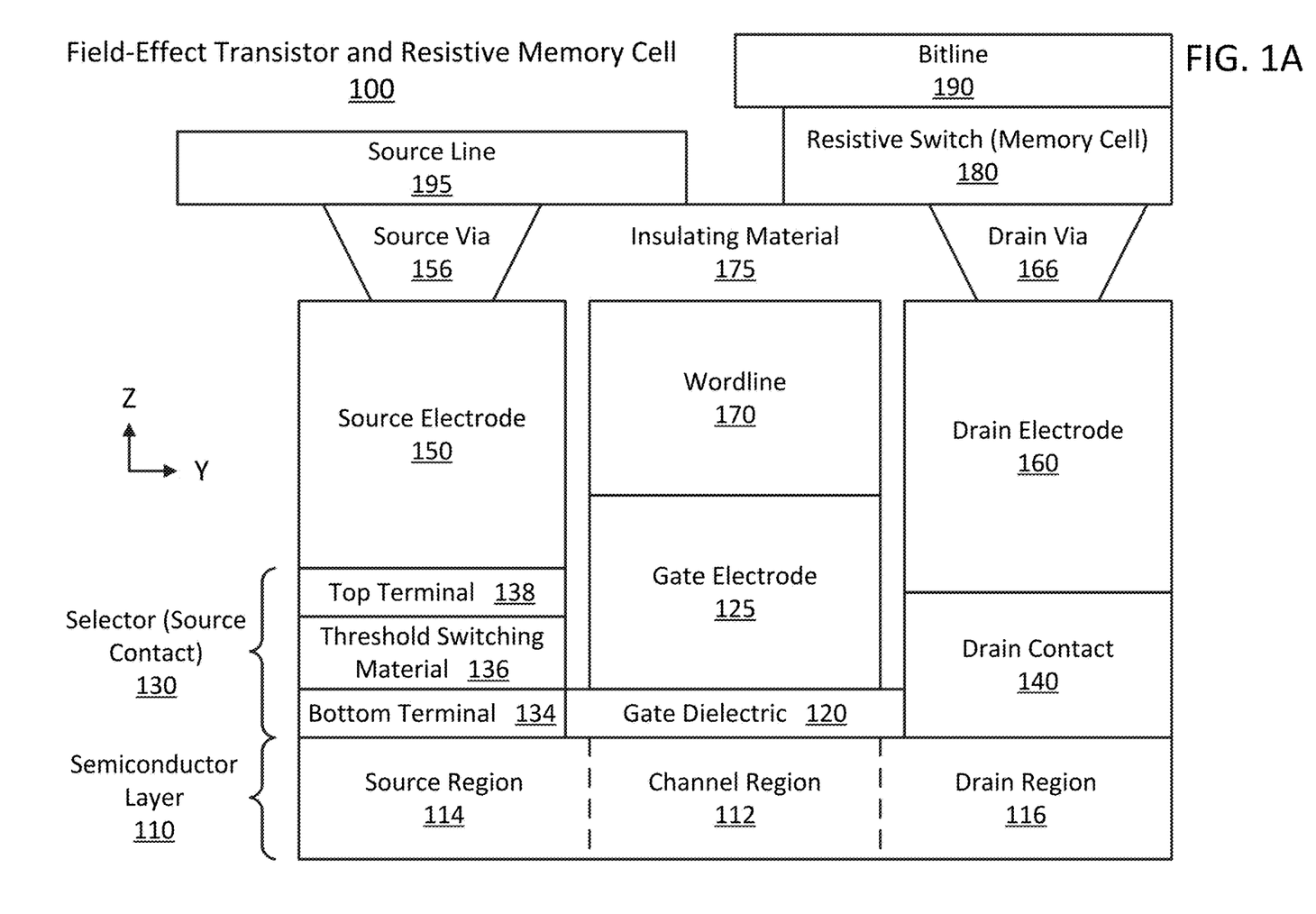
FIGS. 1A-1D are cross-sectional views of example field-effect transistors (FETs) and corresponding resistive or capacitive memory cells, according to embodiments of the present disclosure.

Referring to the FET and resistive memory cell 100 in FIG. 1A, the FET is a top gate thin-film transistor (TFT). However, other embodiments are not so limited, and may be other types of FET, such as a FinFET (e.g., built from a semiconductor fin for a channel region and a gate electrode on, for example, one, two, three, or four sides of the channel region). The FET in FIG. 1A includes a semiconductor layer 110, including a channel region 112, a source region 114, and a drain region 116. The semiconductor layer 110 can include semiconductor material such as silicon (Si), silicon germanium (SiGe), germanium, a Group III-V semiconductor such as gallium arsenide (GaAs) or indium gallium arsenide (InGaAs), to name a few. More generally, a Group III-V semiconductor can be a compound including a Group III element such as boron, aluminum, gallium, and indium together with a Group V element such as nitrogen, phosphorus, arsenic, antimony, and bismuth, with or without other elements. The bandgap of the semiconductor material can be less than or equal to that of silicon (such as a narrow bandgap semiconductor). The semiconductor layer 110 can be, for example, part of an original semiconductor substrate, or grown or otherwise formed or deposited on top of a substrate or other layer.

In some embodiments, the FET is a front end of line (FEOL or frontend) or logic circuit, and the channel region 112) can be one or more of silicon, a silicon-germanium alloy, germanium, and a Group III-V semiconductor. In some other embodiments, the FET is a back end of line (BEOL or backend) circuit, such as a top-gate TFT, and the channel region 112 can includes one or more of zinc oxide, indium oxide, indium tin oxide, aluminum zinc oxide, indium zinc oxide, indium gallium zinc oxide, gallium zinc oxide, tin oxide, copper oxide, and titanium oxide.

While the semiconductor layer 110 is shown as three separate regions (channel region 112, source region 114, and drain region 116), the distinctions between the regions can vary between embodiments. For example, in some embodiments, the three regions may be the same semiconductor material, only doped to different dopant concentrations or types of dopants. For instance, Si can be used with different dopants (e.g., boron (B) for p-type doping, phosphorus (P), As, and antimony (Sb) for n-type doping) and different doping concentrations (e.g., boron to $1 \times 10^{19}$ or greater per cubic centimeter (cc) for highly doped, or to $1 \times 10^{18}$ or less per cc for lightly doped). Dopants can be in the form, for example, of impurities. The transitions in dopant concentrations between regions may be sharp, gradual, or continuous. In some embodiments, one or both of the source region 114 and the drain region 116 is or are separately formed (such as epitaxially grown with in situ doping).

It should be noted that, throughout, terms such as "top" and "upper" as well as "bottom" and "lower" are used primarily for consistency and ease of description with the supplied drawings. However, the actual orientation during some of the fabrication or in some of the final products may differ between embodiments without departing from the scope of the present disclosure. In addition, materials that are "different" or "compositionally different" as used herein generally refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations.

Referring back to the FET in FIG. 1A, a gate structure is formed on the channel region 112. The gate structure includes gate dielectric 120 on the channel region 112 and gate electrode 125 on the gate dielectric 120. The gate structure is adjacent to the channel region 112 and can be implemented with any suitable processes and materials. For instance, the gate dielectric 120 may be any suitable gate dielectric material such as silicon dioxide or high-κ gate dielectric materials. Examples of high-κ gate dielectric materials include, for instance, hafnium oxide (e.g., hafnium dioxide), hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric 120 to improve its quality when a high-κ material is used.

Further, the gate electrode 125 may comprise a wide range of suitable metals, metal alloys, conductive metal oxides, and heavily doped (e.g., degenerate) semiconductors, such as aluminum, tungsten, titanium, tantalum, copper, titanium nitride, or tantalum nitride, for example. In some embodiments, one or both of the gate dielectric 120 and gate electrode 125 may include a multilayer structure of two or more material layers or components. For instance, in one such embodiment, the gate dielectric 120 is a bi-layer structure having a first dielectric material (e.g., silicon dioxide) in contact with the channel region 112 and a second dielectric material (e.g., hafnium oxide) in contact with the first dielectric material, the first dielectric material having a dielectric constant that is lower than the dielectric constant of the second dielectric material. Likewise, the gate electrode 125 structure may include a central metal plug portion (e.g., tungsten) with one or more outer work function layers and/or barrier layers (e.g., tantalum, tantalum nitride), and/ or a resistance reducing cap layer (e.g., copper, gold). In some embodiments, one or both of the gate dielectric 120 and gate electrode 125 may include grading (increasing or decreasing, as the case may be) of the concentration of one or more materials therein. Numerous different gate structure configurations can be used, as will be apparent in light of this disclosure.

Insulating gate spacers (e.g., such as silicon nitride or silicon dioxide) may be provisioned on either side of the gate structure to separate the gate electrode 125 from other conductive structures, such as source and drain contacts.

The FET in FIG. 1A includes a source contact 130 on the source region 114 and that functions as a selector (or selector device). Selectors are two terminal devices that exhibit a voltage-dependent volatile resistance state change. Selector devices are normally high resistance devices. However, when the voltage across the selector (device voltage) exceeds a certain value (a higher voltage known as the threshold voltage), the resistance of the device becomes very low so long as the device voltage remains higher than another voltage value (a lower voltage known as the holding voltage). When the device voltage goes below the holding voltage, the selector device goes back to its insulating/ resistive resistance state. A selector device can thus block or suppress current by keeping the device voltage below the threshold voltage, and can transmit current freely (or relatively freely) by maintaining their device voltage above the holding voltage.

In further detail, a selector device has two terminals separated by a function layer or threshold switching material, such as a threshold switching oxide or threshold switching chalcogenide. The terminals can be any conductive material, such as metal, conductive oxide, degenerate (e.g., heavily doped) semiconductor, or the like. Examples of threshold switching oxides includes niobium dioxide, tantalum oxide, vanadium dioxide, and nickel oxide. An example chalcogenide is silicon tellurium arsenic germanium, such as a chalcogenide glass made from tellurium along with arsenic, germanium, and silicon. A selector device is volatile, maintaining its on state only so long as the voltage across the device exceeds the holding voltage. Unlike FETs, selectors switch abruptly (e.g., to the on state when the applied voltage exceeds the threshold voltage, and back to the off state when the applied voltage falls below the holding voltage) in response to voltage changes across their input/output terminals, while corresponding changes to drain-to-source voltages do not cause such behavior in FETs.

In FIG. 1A, the source contact 130 is a selector, and includes a bottom terminal 134, threshold switching material 136, and a top terminal 138. The bottom terminal 134 can be, for example, a metal that directly contacts the semiconductor material of the source region 114 and forms an ohmic contact with the semiconductor material as well as forms a good contact with the threshold switching material. The threshold switching material 136 can include one or more of a threshold switching oxide and a threshold switching chalcogenide. The top terminal 138 can be metal (such as elemental metal or an alloy of a metal and another element or elements) and that also forms a good contact with the threshold switching material 136. The FET further includes a drain contact 140 that, for example, is a metal forming an ohmic contact with the drain region 116.

The FET further includes a source electrode 150 and a drain electrode 160 (e.g., metal structures that rout or help rout a source signal and a drain signal, respectively, to (or from) the top terminal 138 and the drain contact 140. Still further routing (or interconnecting) can be accomplished with a source via 156 that routs the source signal to or from a source line 195 (such as in a separate interconnect layer from the FET), along with a drain via 166 that routs the drain signal or bitline signal to or from a bitline 190 (e.g., parallel to and in the same interconnect layer as the source line 195). A wordline 170 is electrically connected to the gate electrode 125, and supplies a gate signal to the FET. The wordline 170, for example, extends in the X-direction and in a different interconnect layer than the bitline 190 and source line 195, which extend in the Y-direction in FIG. 1A. Voids or spaces between the electrical circuits are filled with insulating material, such as insulating material 175, which can be, for example, an insulating oxide (such as silicon dioxide) or nitride.

The FET further includes a resistive switch 180 electrically between the bitline 190 and the drain contact 140, and that can function as a memory cell. For example, the resistive switch 180 can be magnetically switchable (such as with a magnetic tunnel junction) between states having different resistances, as in an MRAM cell, or can be a dielectric material that can be switched between a high resistance (or insulating) state and a low resistance (or conducting) state, as in an RRAM cell, or can be chalcogenide glass that switches between resistance states (e.g., crystalline and amorphous) through application of current, as in a PRAM cell, or other type of resistive switch. Unlike selectors, resistive switches (such as those in resistive memories like MRAM, RRAM, and PRAM) are non-volatile, and preserve their resistive states even when power is no longer supplied to the circuit.

Resistive switches often require large amounts of current to change states. The use of low or narrow bandgap semiconductor materials (such as in the channel or body region of the transistor) can help provide such currents. However, these semiconductor materials (or more particularly, the channel regions of FETs made with such semiconductor materials) are also prone to leakage currents along their current paths, as is illustrated further in FIG. 2.

Figure 2:
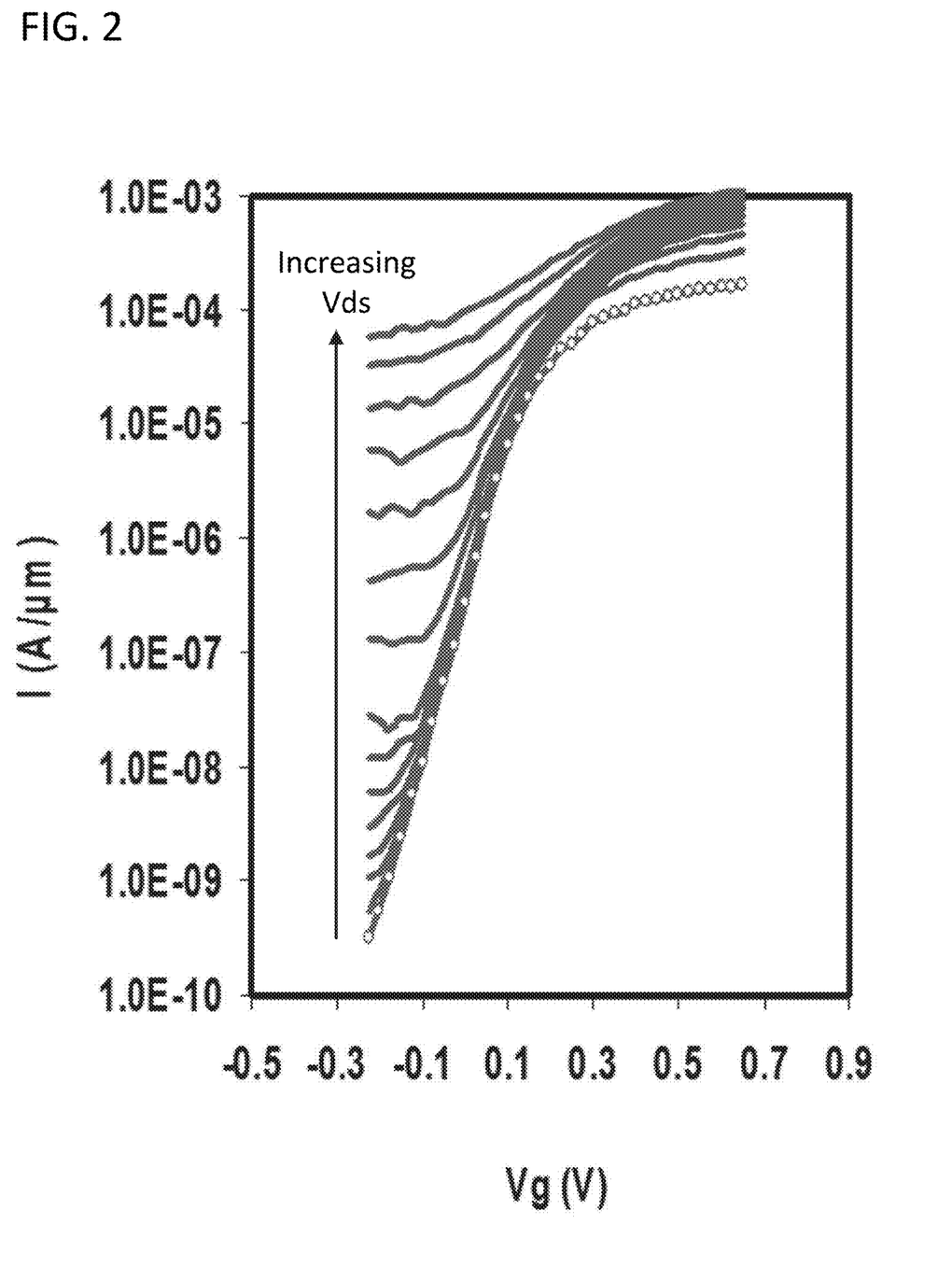
FIG. 2 is a graph of example plots of gate voltage versus drain to source current for 15 different drain to source voltages in a narrow bandgap FET, according to an embodiment of the present disclosure.

FIG. 2 is a graph of example plots of gate voltage (Vg, in volts) versus drain to source current (I, in amperes per micrometer) for 15 different drain to source voltages (Vds) in a narrow bandgap FET (in this case, a scaled III-V semiconductor, namely indium gallium arsenide), according to an embodiment of the present disclosure. The plots in FIG. 2 show increasing leakage current due to effects such as gate-induced drain leakage (GIDL) and band-to-band tunneling (BTBT) at high Vds values. As can be seen, such transistors can be too difficult to turn off at saturation biases, the leakage current effectively keeping the transistors turned on.

Returning to the FET and resistive switch 100 of FIG. 1A, the selector device 130 is designed such that when the gate voltage of the FET corresponding to the off state (e.g., low voltage), but the drain to source voltage of the FET is nonetheless high enough that the leakage current would normally turn on the FET, then the voltage at the selector device 130 is not sufficient to cause the threshold switching material 136 to go to the low resistance state. For instance, the voltage at the selector device 130 is kept below the threshold voltage, such as no more than the holding voltage. Accordingly, the selector 130 stays in the high resistance state, and the leakage current is effectively suppressed by the high resistance of the selector 130 and the low voltage of the holding voltage.

On the other hand, when the gate voltage corresponds to the on state (e.g., high voltage), the extra voltage from the gate effect in combination with the drain to source voltage is sufficient to increase the drain to source current such that the voltage at the selector device 130 exceeds the threshold voltage of the selector 130, which then turns on and current flows normally. For example, the selector 130 can be designed such that the drain to source current increases by at least an order of magnitude (e.g., tenfold) when the gate-on voltage is applied, which is sufficient to raise the voltage at the selector 130 from the holding voltage (and the selector 130 maintained in the high resistance state) to the threshold voltage (and the selector 130 switched to the low resistance state), so current flows normally and is not suppressed by the selector 130.

As such, the selector device 130 effectively reduces the drain to source current (e.g., as shown in FIG. 2) to much lower values when the gate voltage is low (as a FET is intended to operate), but still allows normal operation when the gate voltage is high (again, as a FET is intended to operate). In other words, when the selector device 130 is in the high-resistance state, leakage current from the narrow bandgap FET is significantly reduced, thus keeping the FET turned off when intended. On the other hand, when it is desired to drive the FET, applying sufficient voltage to the selector 130 (e.g., to exceed the threshold voltage of the threshold switching material 136) converts the selector 130 to its low-resistance state, which allows current to flow normally through the selector 130.

Figure 1B:
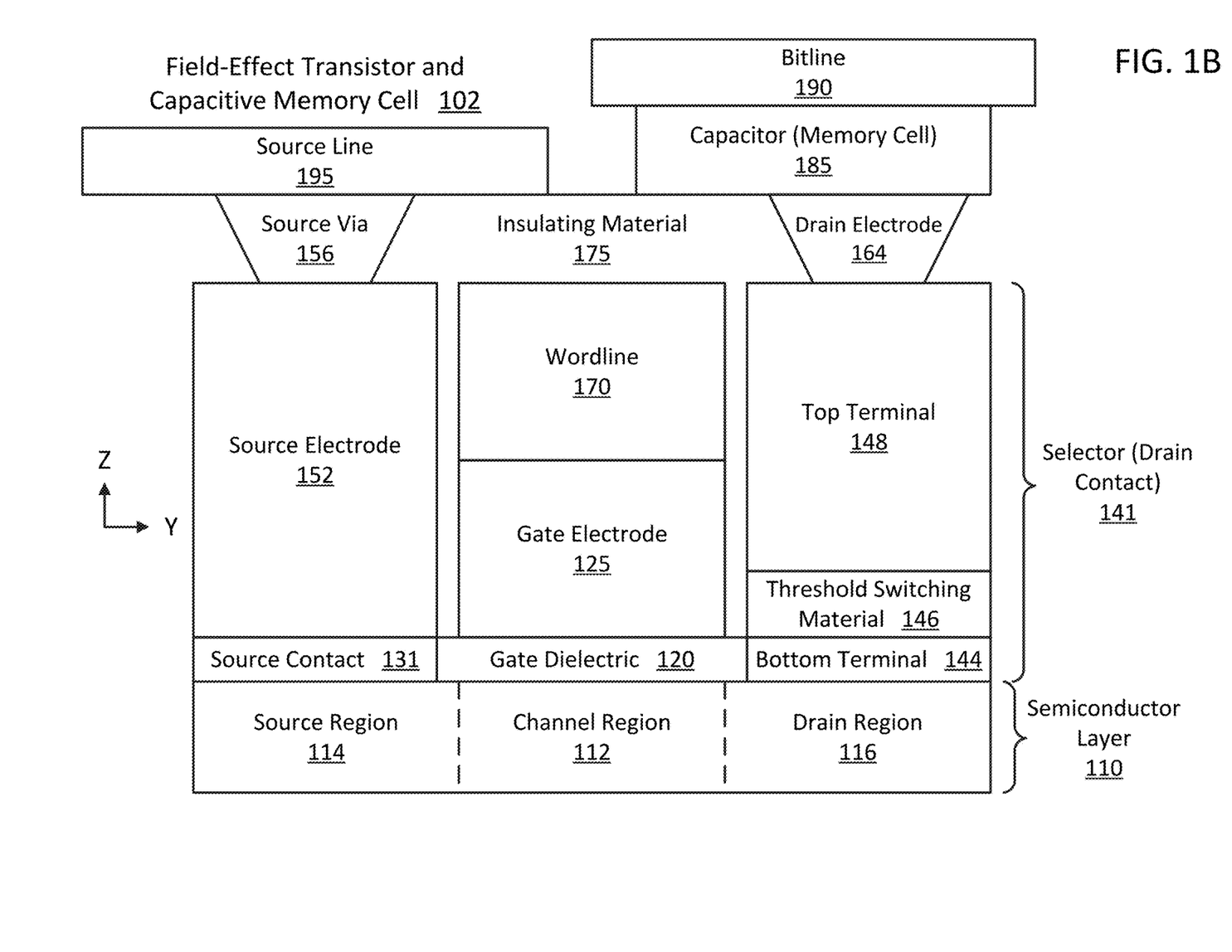

FIG. 1B illustrates a FET and capacitive memory cell 102. The FET and capacitive memory cell 102 of FIG. 1B differ from the FET and resistive memory cell 100 of FIG. 1A primarily in the selector and memory cell design. Other components can be similar to or substantially the same between the two illustrated embodiments.

In the FET and capacitive memory cell 102 of FIG. 1B, selector 141 serves as the drain contact (as opposed to FIG. 1A, where the selector is the source contact 130). In the FET of FIG. 1B, the selector 141 includes a bottom terminal 144 contacting the drain region 116 (such as forming an ohmic contact with the drain region 116), threshold switching material 146 (e.g., similar to the threshold switching material 136 of FIG. 1B), and a top terminal 148, which extends up to the interconnect layer, where it is electrically connected to a drain electrode 164. On the source side, source contact 131 is on (and forms an ohmic contact with) the source region 114, with a source electrode 152 on the source contact 131.

In addition, the drain electrode 164 is coupled to a capacitor 185 (such as a capacitor for a capacitive memory cell, like a DRAM cell) in place of a resistive switch. Capacitors, like resistive switches, can benefit from large driving currents (e.g., to quickly charge them for high-speed memory applications). Further, capacitors can suffer from the leakage current problems of narrow bandgap channel region FETs, only in this case, the state of the capacitor can change from the leakage current draining the stored charge in the capacitor. Accordingly, the selector 141 reduces or minimizes the leakage current from the FET by adding a high-resistance element in the current path from the capacitor 185 to the source line 195 (through the FET). The capacitor 185 can still be charged normally by supplying sufficiently high voltage to the selector 141 (e.g., the threshold voltage of the threshold switching material 146) to cause the selector 141 to enter its low resistance (or on) state.

Figure 1C:
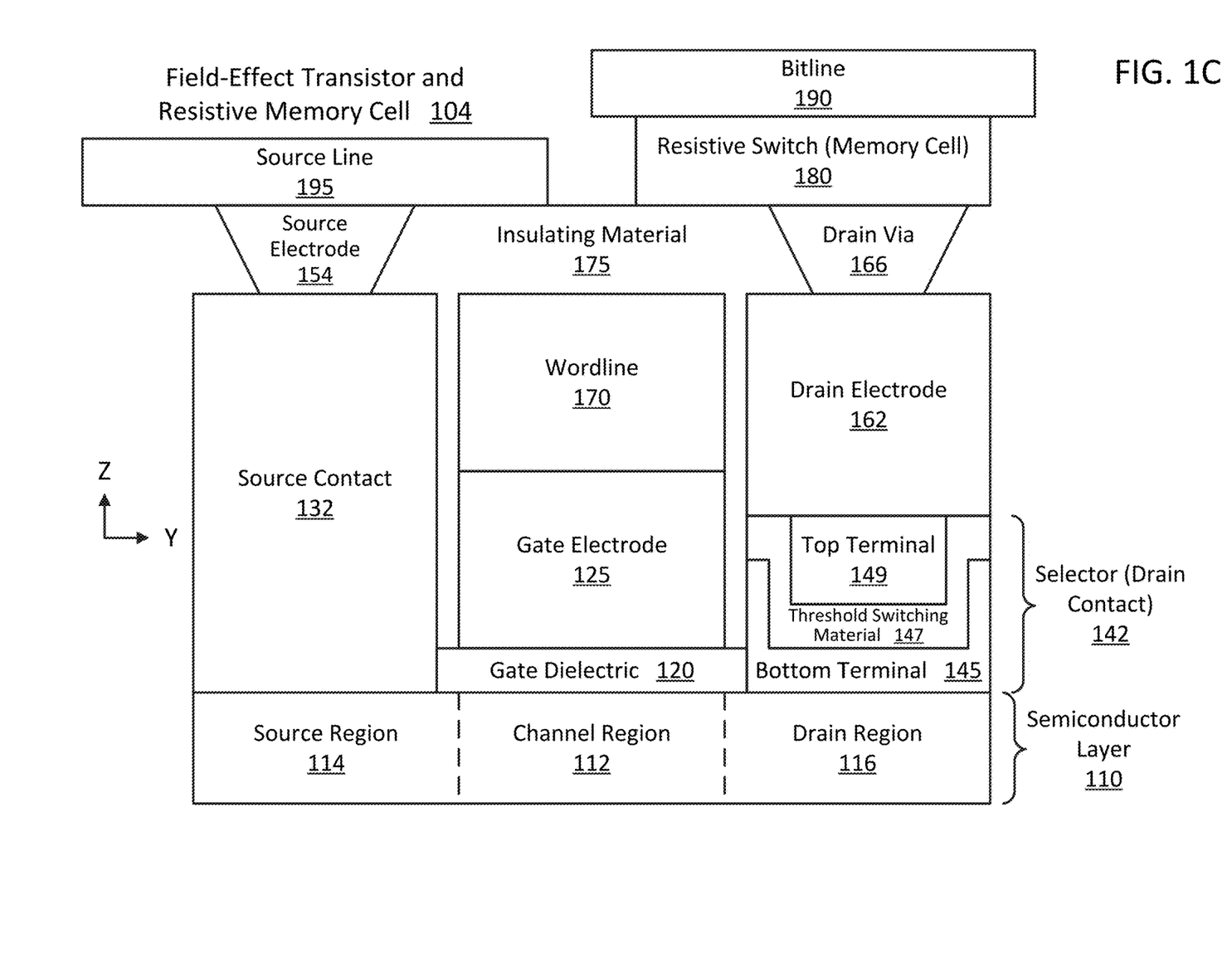
Figure 1D:
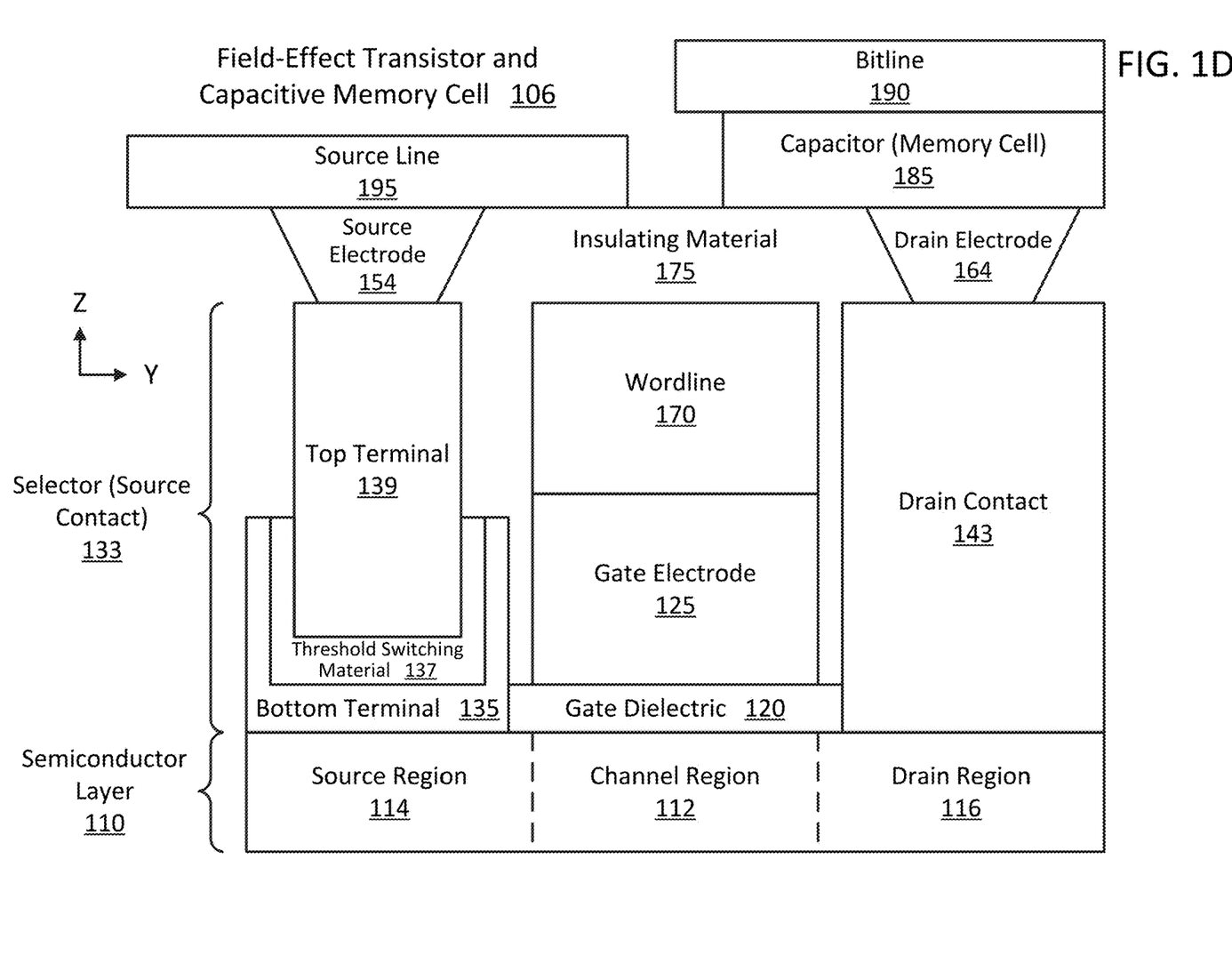

FIGS. 1C-1D illustrate two more possible embodiments of selector and memory cell. In the FET and resistive memory cell 104 of FIG. 1C, selector 142 is the drain contact, and has a U-shaped bottom terminal 145 and threshold switching material 147. A top terminal 149 of the selector 142 is only partially covering the threshold switching material 147 (filling in the U), with a drain electrode 162 covering the rest of the threshold switching material 147. In addition, a source contact 132 makes an ohmic contact with the source region 114 and extends all the way from the source region 114 to the next interconnect layer, where it couples with a source electrode 154. The memory cell 180 is a resistive switch (like FIG. 1A).

In the FET and capacitive memory cell 106 of FIG. 1D, the source and drain components are reversed somewhat from those of FIG. 1C, and the capacitor 185 (e.g., from FIG. 1B) is used in place of a resistive switch for the memory cell. In addition, selector 133 serves as the source contact in the FET of FIG. 1D, and includes a U-shaped bottom terminal 135 and U-shaped threshold switching material 137 (which is a different shape than the threshold switching material 147 of FIG. 1C). To prevent unintended shorting of the bottom terminal 135 with a top terminal 139 of the selector 133, the top terminal 139 fills the U-shape in the threshold switching material 137 and extends vertically to the next interconnect layer (to meet with source electrode 154) and not horizontally (and does not cover the top portion of the threshold switching material 137). Further, drain contact 143 forms an ohmic contact with the drain region 116 and extends to drain electrode 164 in the next interconnect layer.

Figure 3A:
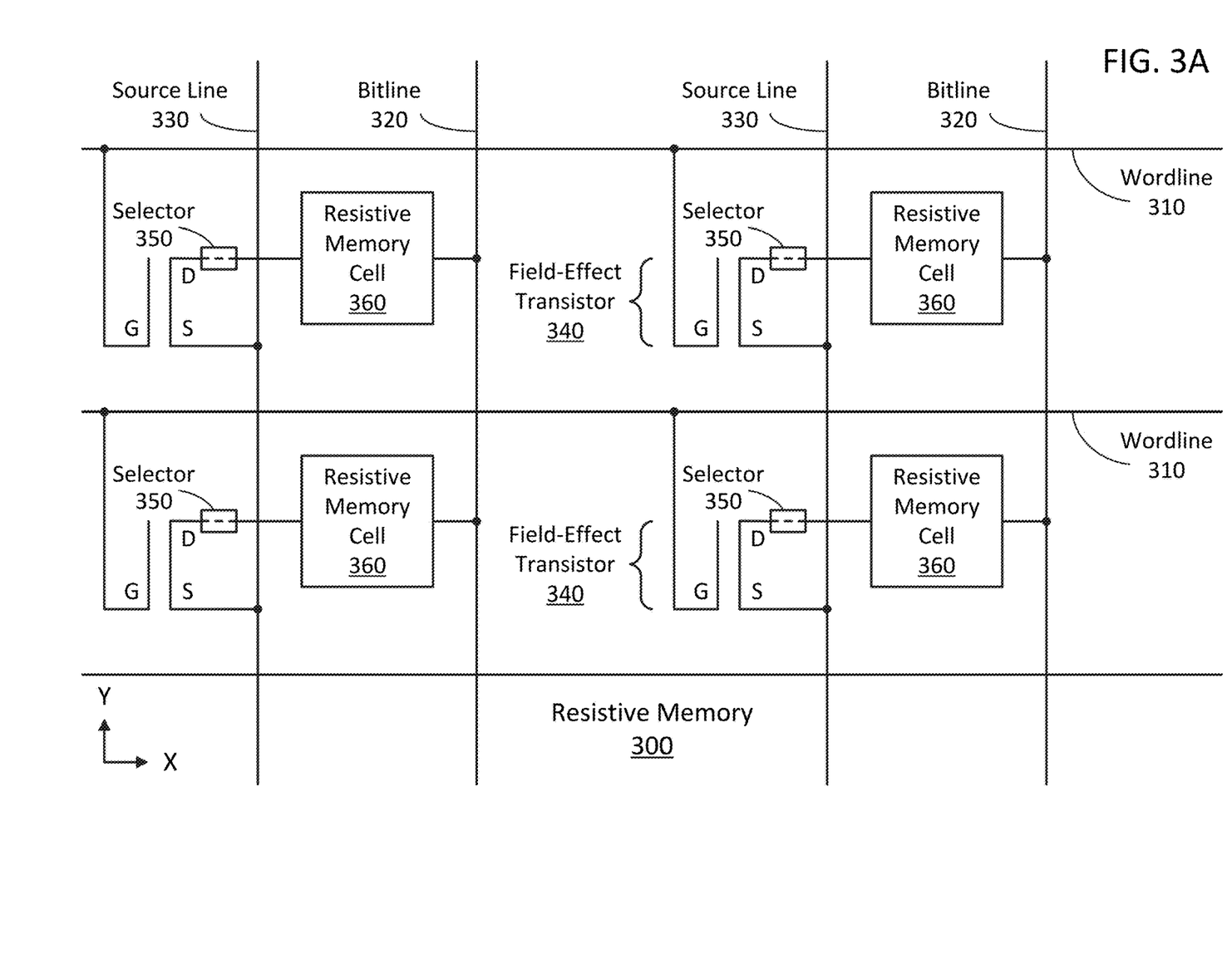
FIGS. 3A-3B are schematic planar views of example resistive and capacitive memories, according to embodiments of the present disclosure.
Figure 3B:
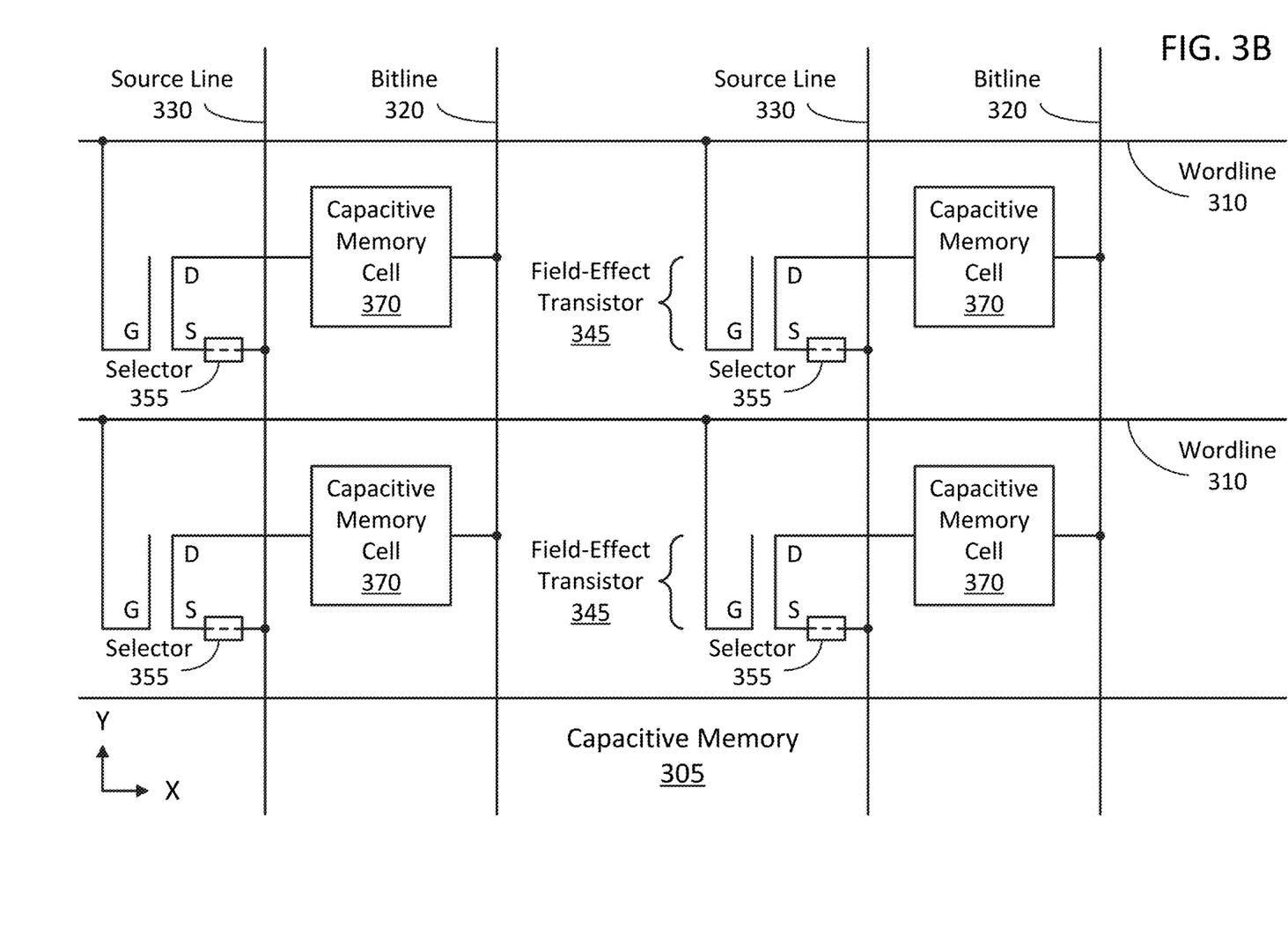

FIGS. 3A-3B are schematic planar (X-Y) views of example resistive and capacitive memories 300 and 305, according to embodiments of the present disclosure. In the resistive memory 300 of FIG. 3A, FETs 340 and resistive memory cells 360 (e.g., MRAM cells, RRAM cells, or PRAM cells) are formed at crossing regions of wordlines 310 (extending in the X-direction), and bitlines 320 and source lines 330 (extending in the Y-direction). Selectors 350 are used in drain contacts in the FETs 340 of the resistive memory 300 (in another embodiment, the selectors 350 can be in source contacts of the FETs 340). The FETs 340 can include low or narrow bandgap semiconductor material in their channel regions, and provide large driving currents to the resistive memory cells 360, with the selectors 350 reducing or substantially eliminating unintended leakage current through the FETs 340.

The capacitive memory 305 of FIG. 3B is similar to the resistive memory 300 of FIG. 3A, except capacitive memory cells 370 (e.g., DRAM cells) are used in place of the resistive memory cells 360, and selectors 355 are in the source contacts of FETs 345 (instead of the drain contacts). The FETs 345 can include low or narrow bandgap semiconductor material in their channel regions, and provide large driving currents to the capacitive memory cells 370, with the selectors 355 reducing or substantially eliminating unintended (capacitor draining) leakage current through the FETs 345.

Methodology

Figure 4:
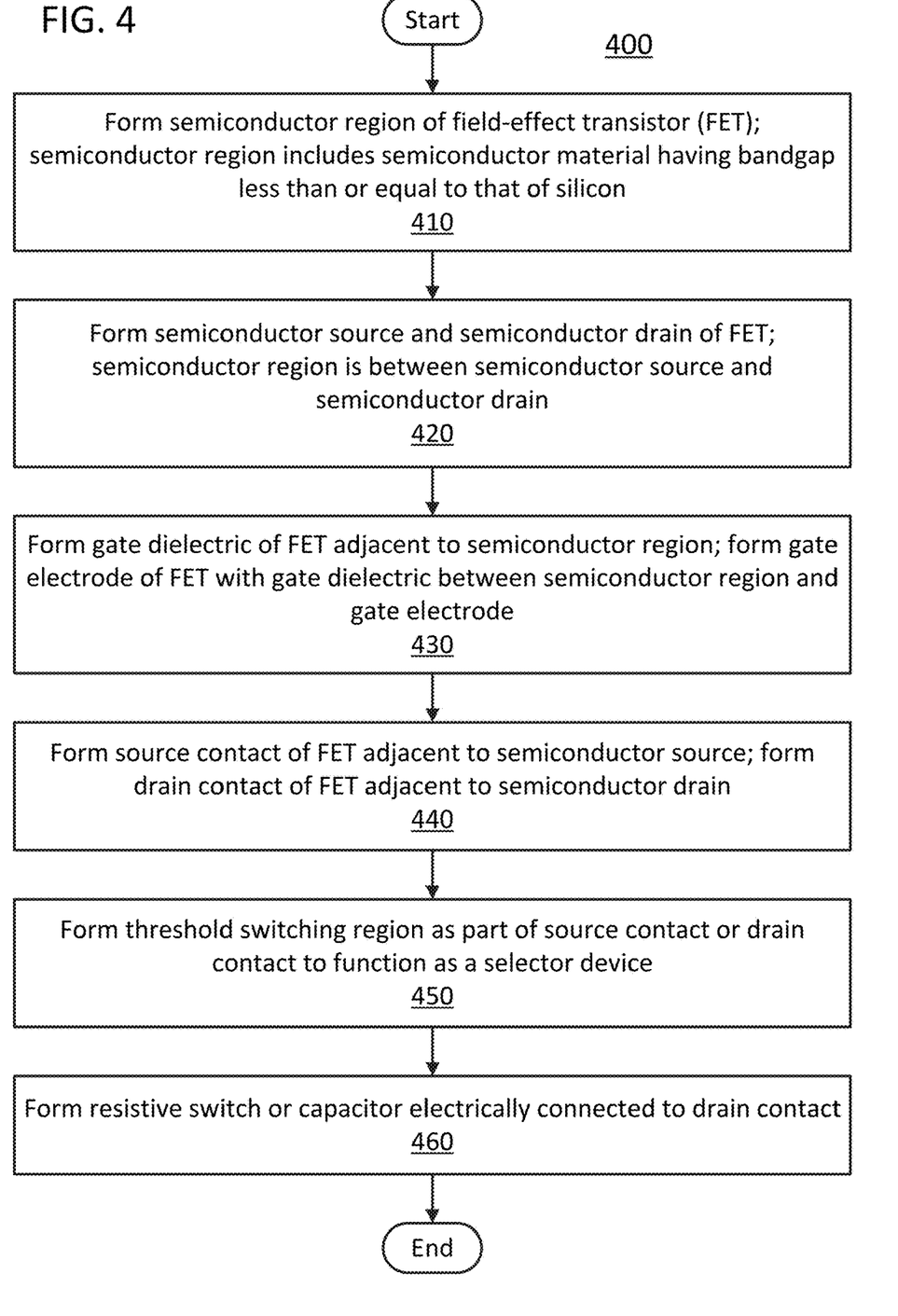
FIG. 4 is a flow diagram of an example method of fabricating an integrated circuit structure, according to an embodiment of the present disclosure.

FIG. 4 is a flow diagram of an example method 400 of fabricating an integrated circuit (IC) structure, according to an embodiment of the present disclosure. This and other methods disclosed herein may be carried out using IC fabrication techniques such as photolithography as would be apparent in light of the present disclosure. The corresponding transistors, capacitors, selectors, resistors, and other devices may be part of other (logic) devices on the same substrate, such as application specific integrated circuits (ASICs), microprocessors, central processing units, processing cores, and the like. Unless otherwise described herein, verbs such as "coupled" or "couple" refer to an electrical coupling (such as capable of transmitting an electrical signal, or electrically conductive), either directly or indirectly (such as through one or more conductive layers in between).

Referring to the method 400 of FIG. 4 (with specific example references to the structures of FIGS. 1A-1D and 3A-3B), processing begins with forming a field-effect transistor (FET, such as FET 340). The forming of the FET includes forming 410 a semiconductor region (such as channel region 112) including a semiconductor material having a bandgap less than or equal to that of silicon. The forming of the FET further includes forming 420 a semiconductor source (such as source region 114) and a semiconductor drain (such as drain region 116), where the semiconductor region is between the semiconductor source and the semiconductor drain. The forming of the FET further includes forming 430 a gate dielectric (such as gate dielectric 120) adjacent to the semiconductor region, and forming a gate electrode with the gate dielectric being between the semiconductor region and the gate electrode.

The forming of the FET further includes forming 440 a source contact (such as source contact 130, 131, 132, or 133) adjacent to the semiconductor source and forming a drain contact (such as drain contact 140, 141, 142, or 143) adjacent to the semiconductor drain. The forming 440 of the source contact or the forming of the drain contact includes forming 450 a threshold switching region (such as threshold switching material 136, 137, 146, or 147) in a respective one of the source contact and the drain contact, to function as a selector device. The method 400 further includes forming 460 a resistive switch or a capacitor electrically connected to the drain contact, such that the threshold switching region acts as a selector for the resistive switch or the capacitor. In some embodiments, the resistive switch is part of a resistive memory cell (such as an RRAM, MRAM, or PRAM cell), or the capacitor is part of a capacitive memory cell (such as a DRAM cell).

While the above example methods appear as a series of operations or stages, it is to be understood that there is no required order to the operations or stages unless specifically indicated.

Example System

Figure 5:
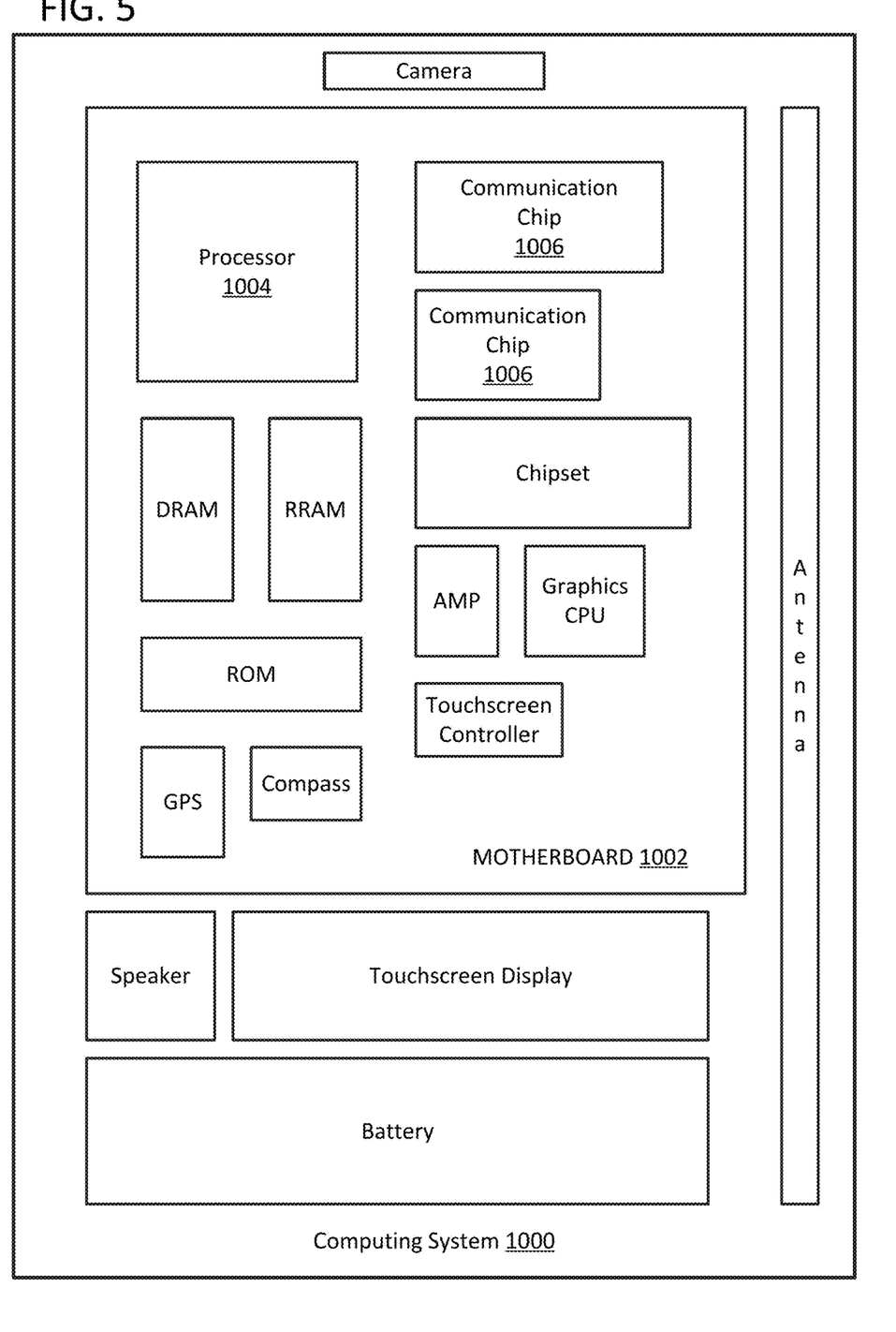
FIG. 5 illustrates an example computing system implemented with the integrated circuit structures or techniques disclosed herein, according to an embodiment of the present disclosure.

FIG. 5 illustrates an example computing system 1000 implemented with the integrated circuit structures or techniques disclosed herein, according to an embodiment of the present disclosure. As can be seen, the computing system 1000 houses a motherboard 1002. The motherboard 1002 may include a number of components, including, but not limited to, a processor 1004 (including resistive or capacitive memory structures as described herein) and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, to name a few examples.

Depending on its applications, computing system 1000 may include one or more other components that may or may not be physically and electrically coupled to the motherboard 1002. These other components may include, but are not limited to, volatile memory (e.g., DRAM), nonvolatile memory (e.g., read-only memory (ROM), resistive random-access memory (RRAM), and the like), a graphics processor, a digital signal processor, a crypto (or cryptographic) processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices (e.g., one or more resistive or capacitive memory structures) formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, and the like, that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices (e.g., resistive or capacitive memory structures) formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices (e.g., resistive or capacitive memory structures) formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices (e.g., resistive or capacitive memory structures) formed using the disclosed techniques, as variously described herein.

Further Example Embodiments

The following examples pertain to further embodiments, from which numerous permutations and configurations will be apparent.

Example 1 is an integrated circuit (IC) structure including: a field-effect transistor (FET) including a semiconductor region including a semiconductor material having a bandgap less than or equal to that of silicon, a semiconductor source and a semiconductor drain, the semiconductor region being between the semiconductor source and the semiconductor drain, a gate electrode, a gate dielectric between the semiconductor region and the gate electrode, a source contact adjacent to the semiconductor source, and a drain contact adjacent to the semiconductor drain; and a resistive switch or a capacitor electrically connected to the drain contact, wherein one of the source contact and the drain contact includes a threshold switching region, to be a selector for the resistive switch or the capacitor.

Example 2 includes the IC structure of Example 1, wherein the resistive switch or the capacitor is part of a resistive memory cell or a capacitive memory cell.

Example 3 includes the IC structure of Example 2, wherein at least one of the resistive switch is electrically connected to the drain contact, the resistive switch is part of the resistive memory cell, and the resistive memory cell is a magnetoresistive random-access memory (MRAM) cell, a resistive random-access memory (RRAM) cell, or a phase-change random-access memory (PRAM) cell, and the capacitor is electrically connected to the drain contact, the capacitor is part of the capacitive memory cell, and the capacitive memory cell is a dynamic random-access memory (DRAM) cell.

Example 4 includes the IC structure of any of Examples 1-3, wherein the one of the source contact and the drain contact further includes: a first terminal between the threshold switching region and a respective one of the semiconductor source and the semiconductor drain; and a second terminal with the threshold switching region being between the first terminal and the second terminal.

Example 5 includes the IC structure of any of Examples 1-4, wherein the threshold switching region includes a threshold switching oxide or a threshold switching chalcogenide.

Example 6 includes the IC structure of Example 5, wherein the threshold switching region includes the threshold switching oxide, which includes at least one of niobium, tantalum, vanadium, and nickel Example 7 includes the IC structure of Example 5 or 6, wherein the threshold switching region includes the threshold switching chalcogenide, which includes silicon, tellurium, arsenic, and germanium.

Example 8 includes the IC structure of any of Examples 1-7, wherein the semiconductor region includes one or more of silicon, germanium, and a group III-V compound semiconductor. In some such cases, the semiconductor region includes an alloy including silicon and germanium.

Example 9 includes the IC structure of any of Examples 1-7, wherein the semiconductor region includes oxygen and one or more of zinc, indium, tin, aluminum, gallium, copper, and titanium.

Example 10 includes the IC structure of Example 9, wherein the semiconductor region further includes one or more of indium and tin, or aluminum and zinc, or indium and zinc, or gallium and zinc.

Example 11 includes the IC structure of Example 10, wherein the semiconductor region further includes indium, gallium, and zinc.

Example 12 includes the IC structure of any of Examples 1-11, wherein the FET is a top gate thin-film transistor (TFT).

Example 13 is a computing system including the IC structure of any of Examples 1-12.

Example 14 is a resistive or capacitive memory having memory cells at crossing regions of wordlines and bitlines, at least one of the memory cells including: a field-effect transistor (FET) including a semiconductor region including a semiconductor material having a bandgap less than or equal to that of silicon, a semiconductor source and a semiconductor drain, the semiconductor region being between the semiconductor source and the semiconductor drain, a gate electrode electrically connected to a corresponding one of the wordlines, a gate dielectric between the semiconductor region and the gate electrode, a source contact adjacent to the semiconductor source, and a drain contact adjacent to the semiconductor drain; and a resistive switch or a capacitor electrically connected to the drain contact and to a corresponding one of the bitlines, wherein one of the source contact and the drain contact includes a threshold switching region, to be a selector for the resistive switch or the capacitor.

Example 15 includes the resistive or capacitive memory of Example 14, wherein the at least one of the memory cells includes at least one magnetoresistive random-access memory (MRAM) cell, at least one resistive random-access memory (RRAM) cell, at least one phase-change random-access memory (PRAM) cell, or at least one dynamic random-access memory (DRAM) cell.

Example 16 includes the resistive or capacitive memory of any of Examples 14-15, further including source lines running parallel to the bitlines, the source contact of the at least one of the memory cells being electrically connected to a corresponding one of the source lines.

Example 17 includes the resistive or capacitive memory of any of Examples 14-16, wherein the one of the source contact and the drain contact further includes: a first terminal between the threshold switching region and a respective one of the semiconductor source and the semiconductor drain; and a second terminal with the threshold switching region being between the first terminal and the second terminal.

Example 18 includes the resistive or capacitive memory of any of Examples 14-17, wherein the threshold switching region includes a threshold switching oxide or a threshold switching chalcogenide.

Example 19 includes the resistive or capacitive memory of any of Examples 14-18, wherein the FET is a front-end-of-line (FEOL) transistor and the semiconductor region includes one or more of silicon, germanium, and a group III-V compound semiconductor.

Example 20 includes the resistive or capacitive memory of Example 19, wherein the semiconductor region further includes an alloy including silicon and germanium.

Example 21 includes the resistive or capacitive memory of any of Examples 14-18, wherein the FET is a back-end-of-line (BEOL) transistor and the semiconductor region includes oxygen and one or more of zinc, indium, tin, aluminum, gallium, copper, and titanium.

Example 22 includes the resistive or capacitive memory of Example 21, wherein the semiconductor region further includes one or more of indium and tin, or aluminum and zinc, or indium and zinc, or gallium and zinc.

Example 23 includes the resistive or capacitive memory of Example 22, wherein the semiconductor region further includes indium, gallium, and zinc.

Example 24 is a computing system including the resistive or capacitive memory of any of Examples 14-23.

Example 25 is a method of fabricating an integrated circuit (IC) structure, the method including: forming a field-effect transistor (FET), the forming of the FET including forming a semiconductor region including a semiconductor material having a bandgap less than or equal to that of silicon, forming a semiconductor source and a semiconductor drain, the semiconductor region being between the semiconductor source and the semiconductor drain, forming a gate dielectric adjacent to the semiconductor region and forming a gate electrode with the gate dielectric being between the semiconductor region and the gate electrode, and forming a source contact adjacent to the semiconductor source and forming a drain contact adjacent to the semiconductor drain; and forming a resistive switch or a capacitor electrically connected to the drain contact, wherein the forming of the source contact or the forming of the drain contact includes forming a threshold switching region in a respective one of the source contact and the drain contact, to be a selector for the resistive switch or the capacitor.

Example 26 includes the method of Example 25, wherein the forming of the source contact or the forming of the drain contact further includes: forming a first terminal between the threshold switching region and a respective one of the semiconductor source and the semiconductor drain; and forming a second terminal with the threshold switching region being between the first terminal and the second terminal.

Example 27 includes the method of any of Examples 25-26, wherein the threshold switching region includes a threshold switching oxide or a threshold switching chalcogenide.

Example 28 is a method of fabricating a resistive or capacitive memory cell including fabricating the IC structure using the method of any of Examples 25-27.

Example 29 is a method of fabricating a computing system including fabricating the IC structure using the method of any of Examples 25-27.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit (IC) structure comprising:
 a field-effect transistor (FET) including a semiconductor region including a semiconductor material having a bandgap less than or equal to that of silicon, a semiconductor source and a semiconductor drain, the semiconductor region being between the semiconductor source and the semiconductor drain, a gate electrode, a gate dielectric between the semiconductor region and the gate electrode, a source contact adjacent to the semiconductor source, and a drain contact adjacent to the semiconductor drain; and a resistive switch or a capacitor electrically connected to the drain contact, wherein one of the source contact and the drain contact comprises a threshold switching region, to be a selector for the resistive switch or the capacitor.

2. The IC structure of claim 1, wherein the resistive switch or the capacitor is part of a resistive memory cell or a capacitive memory cell.

3. The IC structure of claim 2, wherein at least one of the resistive switch is electrically connected to the drain contact, the resistive switch is part of the resistive memory cell, and the resistive memory cell is a magnetoresistive random-access memory (MRAM) cell, a resistive random-access memory (RRAM) cell, or a phase-change random-access memory (PRAM) cell, and the capacitor is electrically connected to the drain contact, the capacitor is part of the capacitive memory cell, and the capacitive memory cell is a dynamic random-access memory (DRAM) cell.

4. The IC structure of claim 1, wherein the one of the source contact and the drain contact further comprises:
 a first terminal between the threshold switching region and a respective one of the semiconductor source and the semiconductor drain; and
 a second terminal with the threshold switching region being between the first terminal and the second terminal.

5. The IC structure of claim 1, wherein the threshold switching region comprises a threshold switching oxide or a threshold switching chalcogenide.

6. The IC structure of claim 5, wherein the threshold switching region comprises the threshold switching oxide, which comprises at least one of niobium, tantalum, vanadium, and nickel.

7. The IC structure of claim 5, wherein the threshold switching region comprises the threshold switching chalcogenide, which comprises silicon, tellurium, arsenic, and germanium.

8. The IC structure of claim 1, wherein the semiconductor region comprises one or more of silicon, germanium, and a group III-V compound semiconductor.

9. The IC structure of claim 1, wherein the semiconductor region comprises oxygen and one or more of zinc, indium, tin, aluminum, gallium, copper, and titanium.

10. The IC structure of claim 9, wherein the semiconductor region further comprises one or more of indium and tin, or aluminum and zinc, or indium and zinc, or gallium and zinc.

11. The IC structure of claim 10, wherein the semiconductor region further comprises indium, gallium, and zinc.

12. The IC structure of claim 1, wherein the FET is a top gate thin-film transistor (TFT).

13. A resistive or capacitive memory having memory cells at crossing regions of wordlines and bitlines, at least one of the memory cells comprising:
    a field-effect transistor (FET) including a semiconductor region including a semiconductor material having a bandgap less than or equal to that of silicon, a semiconductor source and a semiconductor drain, the semiconductor region being between the semiconductor source and the semiconductor drain, a gate electrode electrically connected to a corresponding one of the wordlines, a gate dielectric between the semiconductor region and the gate electrode, a source contact adjacent to the semiconductor source, and a drain contact adjacent to the semiconductor drain; and
    a resistive switch or a capacitor electrically connected to the drain contact and to a corresponding one of the bitlines, wherein one of the source contact and the drain contact comprises a threshold switching region, to be a selector for the resistive switch or the capacitor.

14. The resistive or capacitive memory of claim 13, wherein the at least one of the memory cells includes at least one magnetoresistive random-access memory (MRAM) cell, at least one resistive random-access memory (RRAM) cell, at least one phase-change random-access memory (PRAM) cell, or at least one dynamic random-access memory (DRAM) cell.

15. The resistive or capacitive memory of claim 13, further comprising source lines running parallel to the bitlines, the source contact of the at least one of the memory cells being electrically connected to a corresponding one of the source lines.

16. The resistive or capacitive memory of claim 13, wherein the one of the source contact and the drain contact further comprises:
    a first terminal between the threshold switching region and a respective one of the semiconductor source and the semiconductor drain; and
    a second terminal with the threshold switching region being between the first terminal and the second terminal.

17. The resistive or capacitive memory of claim 13, wherein the threshold switching region comprises a threshold switching oxide or a threshold switching chalcogenide.

18. The resistive or capacitive memory of claim 13, wherein the FET is a front-end-of-line (FEOL) transistor and the semiconductor region comprises one or more of silicon, germanium, and a group III-V compound semiconductor, or the FET is a back-end-of-line (BEOL) transistor and the semiconductor region comprises oxygen and one or more of zinc, indium, tin, aluminum, gallium, copper, and titanium.

19. A method of fabricating an integrated circuit (IC) structure, the method comprising:
    forming a field effect transistor (FET), the forming of the FET including forming a semiconductor region including a semiconductor material having a bandgap less than or equal to that of silicon, forming a semiconductor source and a semiconductor drain, the semiconductor region being between the semiconductor source and the semiconductor drain, forming a gate dielectric adjacent to the semiconductor region and forming a gate electrode with the gate dielectric being between the semiconductor region and the gate electrode, and forming a source contact adjacent to the semiconductor source and forming a drain contact adjacent to the semiconductor drain; and
    forming a resistive switch or a capacitor electrically connected to the drain contact, wherein the forming of the source contact or the forming of the drain contact comprises forming a threshold switching region in a respective one of the source contact and the drain contact, to be a selector for the resistive switch or the capacitor.

20. The method of claim 19, wherein the forming of the source contact or the forming of the drain contact further comprises:
    forming a first terminal between the threshold switching region and a respective one of the semiconductor source and the semiconductor drain; and
    forming a second terminal with the threshold switching region being between the first terminal and the second terminal.

* * * * *